(12) United States Patent
Shinjo et al.

(10) Patent No.: US 6,177,793 B1
(45) Date of Patent: Jan. 23, 2001

(54) MAGNETIC DETECTOR WHICH DETECTS A ROTATIONAL ANGLE OF A ROTARY MEMBER

(75) Inventors: Izuru Shinjo; Yasuyoshi Hatazawa; Takuji Nada; Masahiro Yokotani, all of Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/163,980

(22) Filed: Sep. 30, 1998

(30) Foreign Application Priority Data

Apr. 24, 1998 (JP) ................................................. 10-115247

(51) Int. Cl.[7] ........................................................ G01B 7/30
(52) U.S. Cl. .................................. 324/207.25; 324/207.21
(58) Field of Search ........................... 324/207.2, 207.21, 324/207.23, 207.24, 207.25, 252, 160, 166, 173, 174; 338/32 R

(56) References Cited

FOREIGN PATENT DOCUMENTS

| 3929452A1 | 3/1991 | (DE) . |
|---|---|---|
| 196 49 400 A1 | 12/1997 | (DE) . |
| 195 80 095 C2 | 2/1998 | (DE) . |
| 7-260813 | 10/1995 | (JP) . |
| 8-193839 | 7/1996 | (JP) . |

*Primary Examiner*—Jay Patidar
(74) *Attorney, Agent, or Firm*—Sughrue, Mion, Zinn, Macpeak & Seas, PLLC

(57) ABSTRACT

A magnetic detector D is disclosed which can perform precise detection even when a moving member of magnetic material is rotating at a very low speed, and can output a signal corresponding to recessed and projected portions of the moving member of magnetic material when the power is turned on and when the rotary member of magnetic material is stopped. The magnetic detector includes a rotary member of magnetic material, a detecting unit for detecting a displacement of the rotary member of magnetic material, an AC coupling circuit for removing a DC component from an output signal of the detecting unit, a comparison circuit for converting an output signal of the AC coupling circuit into a binary signal, an output circuit for outputting an output signal of the comparison circuit, and a variable resistor for setting a comparison level for the comparison circuit to a level between two different signal levels.

16 Claims, 16 Drawing Sheets

FIG. 5A
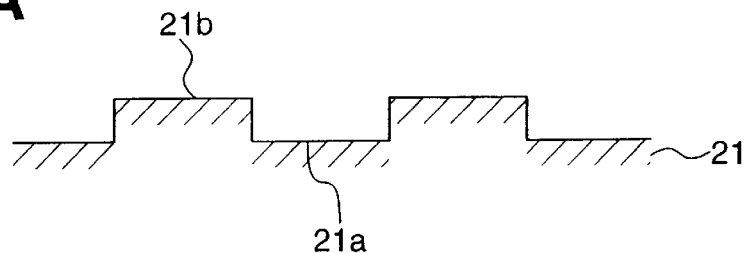
FIG. 5B
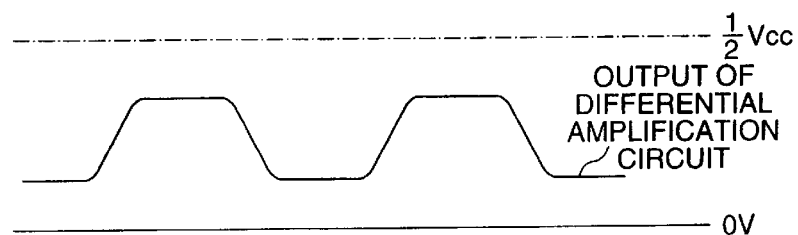
FIG. 5C
FIG. 5D
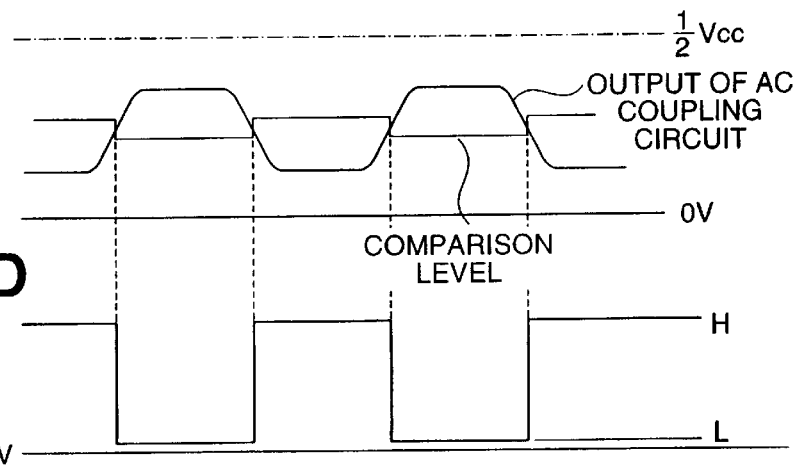

ROTARY SHAFT

MAGNETIZED DIRECTION
(OPPOSING DIRECTION TO
ROTARY MEMBER 21 OF
MAGNETIC MATERIAL)

MR DEVICE B

MR DEVICE A

DURING HIGH-SPEED ROTATION

DURING LOW-SPEED ROTATION

MAGNETIC DETECTOR WHICH DETECTS A ROTATIONAL ANGLE OF A ROTARY MEMBER

BACKGROUND OF THE INVENTION

1. Field of the Invention

The present invention relates to a magnetic detector for detecting, e.g., a rotational angle of a gear-like rotary member of magnetic material, and more particularly to a magnetic detector for detecting, e.g., rotation information of an internal combustion engine.

2. Description of the Related Art

FIG. 10 is a side view of a conventional magnetic detector, FIG. 11 is a side sectional view thereof, FIG. 12 is a schematic view showing a magnetic circuit of the magnetic detector, and FIG. 13 is an electric circuit diagram of the magnetic detector.

A detector body 1 comprises a cylindrical case 3 made of a synthetic resin, an electric circuit unit 4 housed in the case 3, a parallelepiped magnet 5 provided at a fore end of the electric circuit unit 4, and a detecting unit 6 provided in a front surface of the magnet 5 and including a magnetic field sensing device built therein.

In such a magnetic detector, when a gear-like rotary member of magnetic material 21 provided close to the magnetic detector is rotated, a recessed portion 21a and a projected portion 21b of the rotary member of magnetic material 21 alternately approaches the detecting unit 6, whereupon a magnetic field applied from the magnet 5 to the detecting unit 6 is changed. Changes in the applied magnetic field are detected as voltage changes by the detecting unit 6. The voltage changes are outputted in the form of a pulse-wave electric signal through a differential amplification circuit 12, an AC coupling circuit 13, a comparison circuit 14 and an output circuit 15 in the detecting unit 6. The electric signal is sent through a terminal of a connector 2 to a computer unit (not shown) which processes the electric signal to detect a rotational angle of the rotary member of magnetic material 21.

Generally, a magnetoresistive device (referred to as MR device hereinafter) or a giant magnetoresistance device (referred to as GMR device hereinafter) is employed as the magnetic field sensing device. The magnetic detector operates basically in the same manner in both cases of using the MR device and the GMR device; hence the operation in the case of using the MR device will be described below in detail.

The MR device is a device of which resistance value varies depending on an angle formed between the magnetized direction and the current direction in a thin film of a ferromagnetic material (e.g., Ni—Fe or Ni—Co). The MR device has a minimum resistance value when the current direction and the magnetized direction cross at a right angle, and a maximum resistance value when the current direction and the magnetized direction cross at 0 degree, i.e., when the two directions are the same or exactly opposed to each other. Such a change in resistance value is called an MR change rate and generally ranges 2–3% for Ni—Fe and 5–6% for Ni—Co.

When the rotary member of magnetic material 21 rotates, the magnetic field applied to the MR device is changed and a resistance value of the MR device is also changed. For detecting changes in magnetic field, it is conceivable to form a bridge circuit with MR devices, connect a constant-voltage and constant-current power supply to the bridge circuit, and convert changes in resistance values of the MR devices into voltage changes, thereby detecting changes in the magnetic field acting on the MR devices.

FIG. 14 is a schematic view showing a magnetic circuit of a conventional magnetic detector using MR devices, and FIG. 15 is an electric circuit diagram of the conventional magnetic detector.

The conventional magnetic detector comprises a bridge circuit 11 using MR devices, a differential amplification circuit 12 for amplifying an output of the bridge circuit 11, an AC coupling circuit 13 for removing a DC component in an output of the differential amplification circuit 12, a comparison circuit 14 for comparing an output of the AC coupling circuit 13 with a reference value and outputting a signal having a level of "0" or "1", and an output circuit 15 for receiving an output of the comparison circuit 14 and shaping an output signal through switching operation.

The bridge circuit 11 includes MR devices A and B. The MR device A is connected at one terminal to a power source terminal Vcc, and the MR device B is grounded at one terminal. The other terminals of the MR devices A and B are connected to a junction point A. Then, the junction point A of the bridge circuit 11 is connected to an inverted input terminal of an amplifier in the differential amplification circuit 12. A non-inverted input terminal of the amplifier is connected through a resistor to a voltage dividing circuit which constitutes a reference power supply, and then grounded through a resistor. An output terminal of the amplifier is connected to the inverted input terminal thereof through a resistor, and also to one terminal of a capacitor of the AC coupling circuit 13.

The AC coupling circuit 13 comprises one capacitor and one resistor. The other terminal of the capacitor is connected to one terminal of the resistor and then to an inverted input terminal of an amplifier in the comparison circuit 14. The other terminal of the resistor is connected to a voltage dividing circuit which constitutes a reference power supply for the comparison circuit 14. A non-inverted input terminal of the amplifier in the comparison circuit 14 is connected to a voltage dividing circuit which constitutes a reference power supply, and also to an output terminal thereof through a resistor. An output terminal of the amplifier in the comparison circuit 14 is connected to the power source terminal Vcc through a resistor, and also to a base of a transistor in the output circuit 15. A collector of the transistor is connected to an output terminal and also to the power source terminal Vcc through a resistor, whereas an emitter of the transistor is grounded.

FIG. 16 is a waveform chart showing the waveform processing operation of the conventional magnetic detector when the rotary member of magnetic material 21 is rotating at a high speed.

Upon rotation of the rotary member of magnetic material 21, the MR devices are subject to changes in magnetic field and the differential amplification circuit 12 produces an output, shown in FIG. 16B, that varies corresponding to the alternately projected and recessed portions of the rotary member of magnetic material 21 shown in FIG. 16A. The output of the differential amplification circuit 12 is supplied to the AC coupling circuit 13 where a DC component in the amplified output is removed and a reference voltage (½ vcc) for the comparison circuit 14 is then applied as a DC component. The output of the AC coupling circuit 13 is supplied to the comparison circuit 14 and compared with a reference value, i.e., a comparison level, set in the comparison circuit 14 for conversion into a signal having a level of "0" or "1", as shown in FIG. 16C. This signal is then shaped in waveform by the output circuit 15. As a result, an output having steep rising and lowering edges and a level of "0" or "1", shown in FIG. 16D, is produced at the output terminal of the output circuit 15.

FIG. 17 is a waveform chart showing the waveform processing operation of the conventional magnetic detector when the rotary member of magnetic material 21 is rotating at a low speed.

Upon rotation of the rotary member of magnetic material 21, the MR devices are subject to changes in magnetic field and the differential amplification circuit 12 produces an output, shown in FIG. 17B, that varies corresponding to the alternately projected and recessed portions of the rotary member of magnetic material 21 shown in FIG. 17A. The output of the differential amplification circuit 12 is supplied to the AC coupling circuit 13 where a DC component in the amplified output is removed and a reference voltage (½ Vcc) for the comparison circuit 14 is then applied as a DC component. The output of the AC coupling circuit 13 is supplied to the comparison circuit 14 and compared with a reference value, i.e., a comparison level, set in the comparison circuit 14 for conversion into a signal having a level of "0" or "1", as shown in FIG. 17C. This signal is then shaped in waveform by the output circuit 15. As a result, an output having steep rising and lowering edges and a level of "0" or "1", shown in FIG. 17D, is produced at the output terminal of the output circuit 15.

The conventional magnetic detector described above, however, has had problems below.

As seen from FIG. 17, in the conventional magnetic detector, because the output has a peak corresponding to each edge of the projected portion 21b of the rotary member of magnetic material 21, precise detection is not ensured when the rotary member of magnetic material 21 is rotating at a very low speed.

Also, because there is no difference between signals produced respectively when the recessed portion 21a and the projected portion 21b of the rotary member of magnetic material 21 are opposed to the MR devices, the conventional magnetic detector cannot output a signal having levels corresponding to the recessed and projected portions when power is turned on and when the rotary member of magnetic material is stopped.

SUMMARY OF THE INVENTION

With a view of solving the problems described above, an object of the present invention is to provide a magnetic detector which can perform precise detection even when a moving member of magnetic material is rotating at a very low speed, and can output a signal having levels corresponding to recessed and projected portions of the moving member of magnetic material when power is turned on and when the rotary member of magnetic material is stopped.

A magnetic detector according to a first aspect of the present invention comprises a moving member of magnetic material, a detecting unit for detecting a displacement of the moving member of magnetic material, a DC component removing means for removing a DC component from an output signal of the detecting unit, a converting means for converting an output signal of the DC component removing means into a binary signal, an output means for outputting an output signal of the converting means to the external, and an adjusting means for setting a conversion reference level for the converting means to a level between different levels of two signals.

In a magnetic detector according to a second aspect of the present invention, in addition to the features of the first aspect, output signals of the detecting unit corresponding to projected and recessed portions of the moving member of magnetic material have maximum and minimum levels or minimum and maximum levels, respectively.

In a magnetic detector according to a third aspect of the present invention, in addition to the features of the first aspect, the detector includes a magnetic field generating means for generating a magnetic field, a magnetic field sensing device is used as the detecting unit, the moving member of magnetic material is disposed with a predetermined gap left relative to the magnetic field generating means and is able to change the magnetic field generated by the magnetic field generating means, the magnetic field sensing device detects changes in the magnetic field upon movement of the moving member of magnetic material, and the magnetic field sensing device is arranged to have a magnetism detecting direction parallel to the magnetized direction of the magnetic field generating means.

In a magnetic detector according to a fourth aspect of the present invention, in addition to the feature of the third aspect, the magnetic field sensing device comprises a vertically-sensitive magnetic field sensing device which is arranged between the magnetic field generating means and the moving member of magnetic material.

In a magnetic detector according to fifth aspect of the present invention, in addition to the features of the third aspect, the magnetic field sensing device comprises an in-plane-sensitive magnetic field sensing device which is provided on at least one of first and second surfaces of the magnetic field generating means and arranged so that the output signal of the magnetic field sensing device has a predetermined waveform.

In a magnetic detector according to a sixth aspect of the present invention, in addition to the features of the fifth aspect, at least two magnetic field sensing device s are disposed to lie side by side in a direction opposing to the magnetic field generating means, and a second center axis of the magnetic field sensing device s is arranged to be substantially aligned with an end surface of the magnetic field generating means which is opposed to the moving member of magnetic material.

In a magnetic detector according to a seventh aspect of the present invention, in addition to the features of the fifth aspect, at least two magnetic field sensing device s are disposed to lie side by side in a rotating direction of the moving member of magnetic material, and a second center axis of the magnetic field sensing device s is arranged rearward of an end surface of the magnetic field generating means which is opposed to the moving member of magnetic material.

In a magnetic detector according to an eighth aspect of the present invention, in addition to the features of the fifth aspect, the magnetic field sensing device comprises a giant magnetoresistance device.

BRIEF DESCRIPTION OF THE DRAWINGS

FIG. 5 is a waveform chart showing the waveform processing operation of the magnetic detector according to Embodiment 2 of the present invention;

DESCRIPTION OF THE PREFERRED EMBODIMENTS

Preferred embodiments of the present invention will be described below with reference to the drawings.
Embodiment 1.

Figure 1:
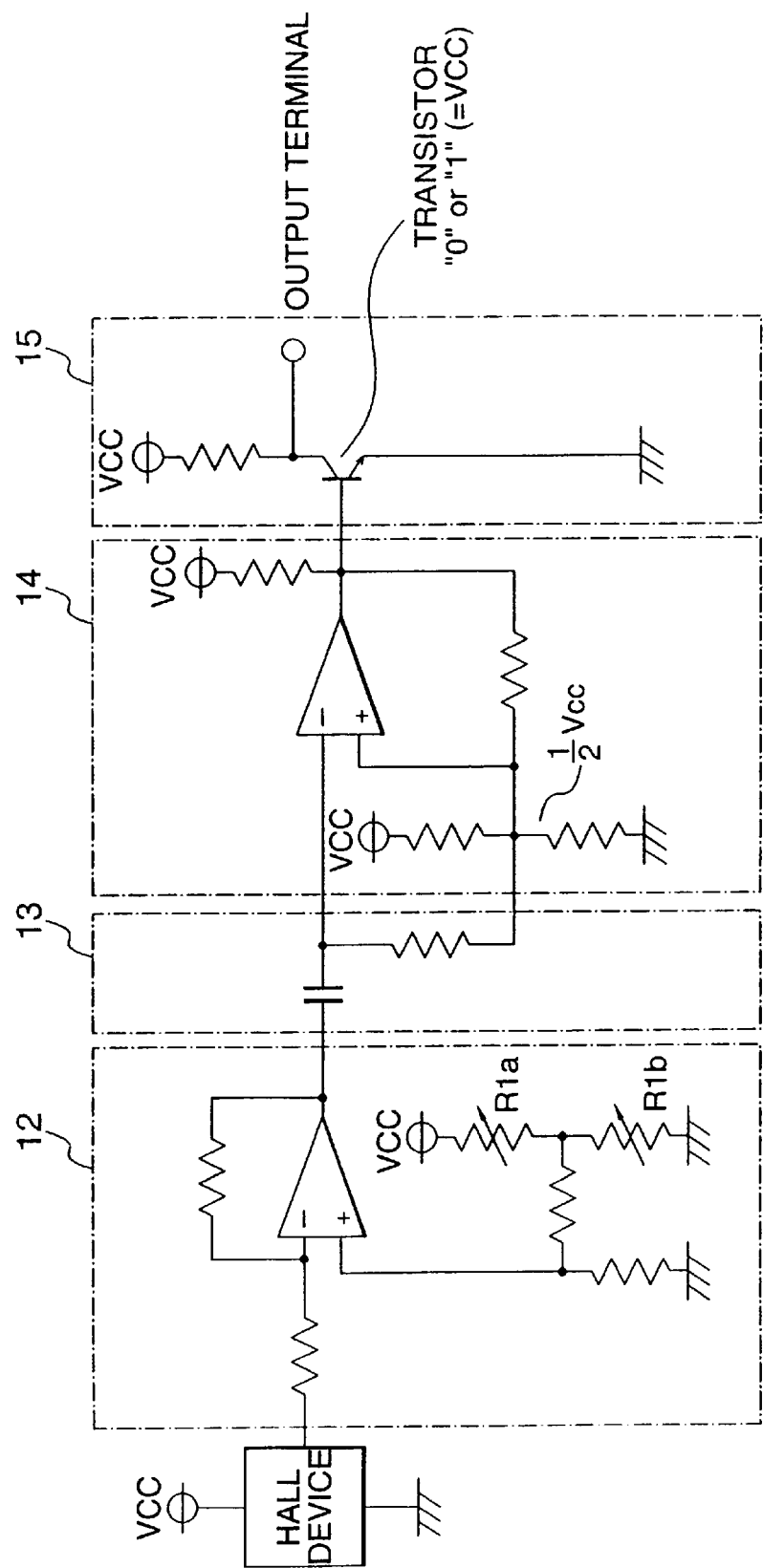
FIG. 1 is an electric circuit diagram of a magnetic detector according to Embodiment 1 of the present invention.
Figure 2A:
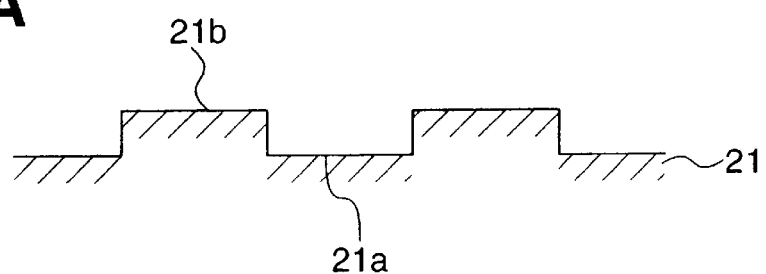
FIG. 2 is a waveform chart showing the waveform processing operation of the magnetic detector according to Embodiment 1 of the present invention.
Figure 2B:
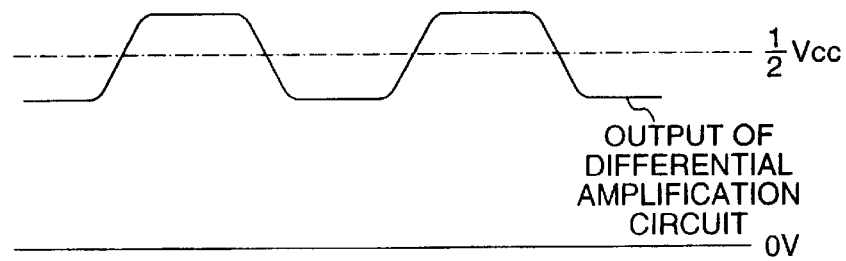
Figure 2C:
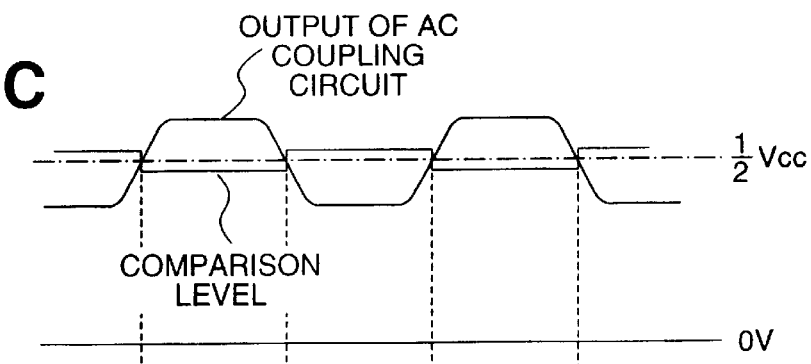
Figure 2D:
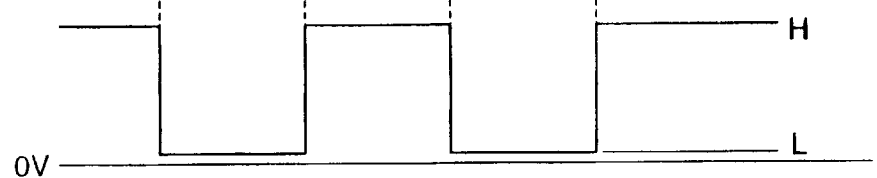
Figure 3A:
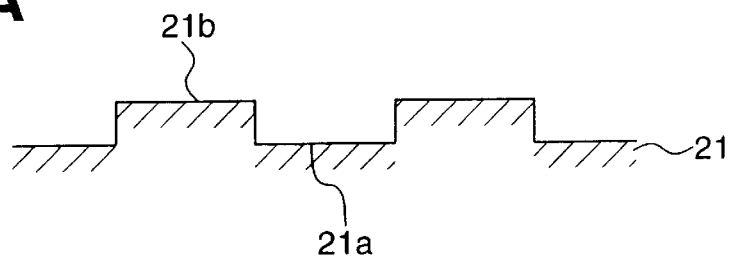
FIG. 3 is a waveform chart showing the waveform processing operation of the magnetic detector according to Embodiment 1 of the present invention.
Figure 3B:
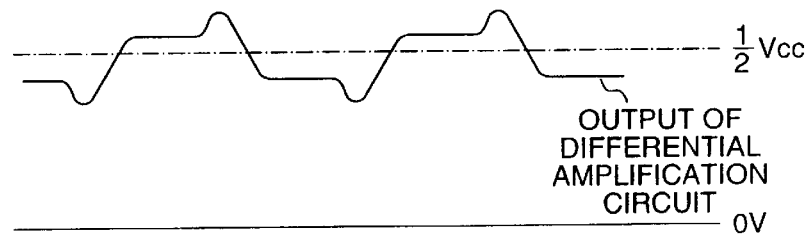
Figure 3C:
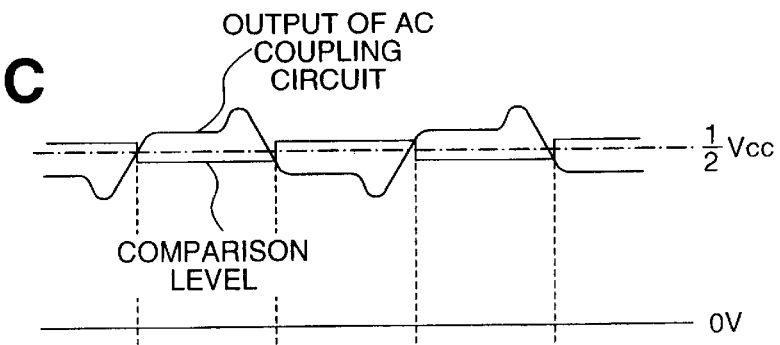
Figure 3D:
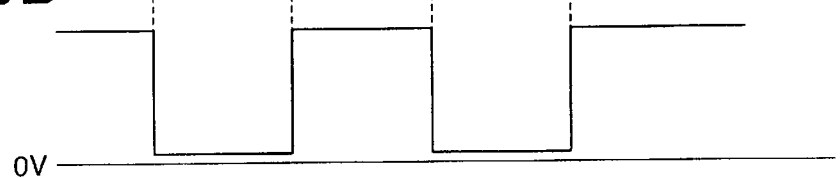

FIG. 1 is an electric circuit diagram of a magnetic detector according to Embodiment 1 of the present invention, and FIG. 2 is a waveform chart showing the waveform processing operation of the magnetic detector.

Figure 12A:
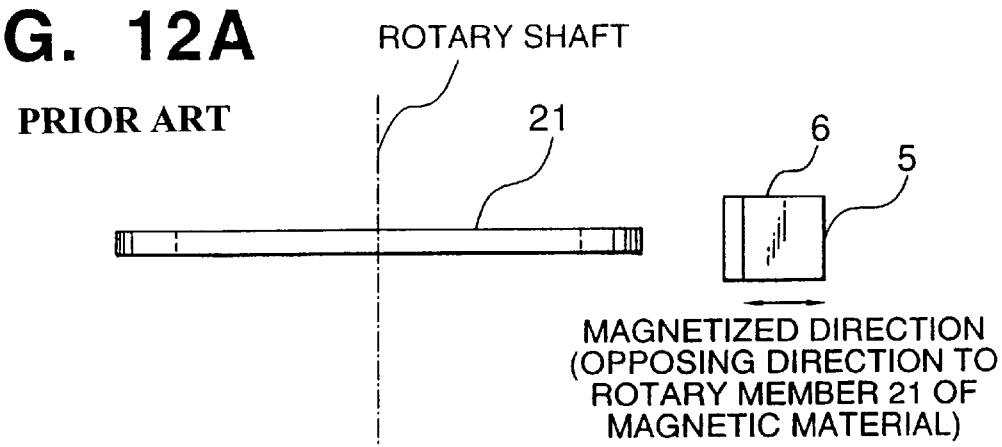
FIG. 12 is a schematic view showing a magnetic circuit of the conventional magnetic detector.
Figure 12B:
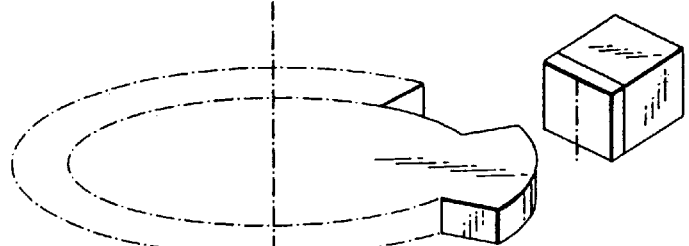
Figure 12C:
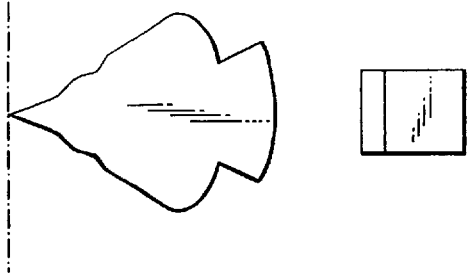
Figure 13:
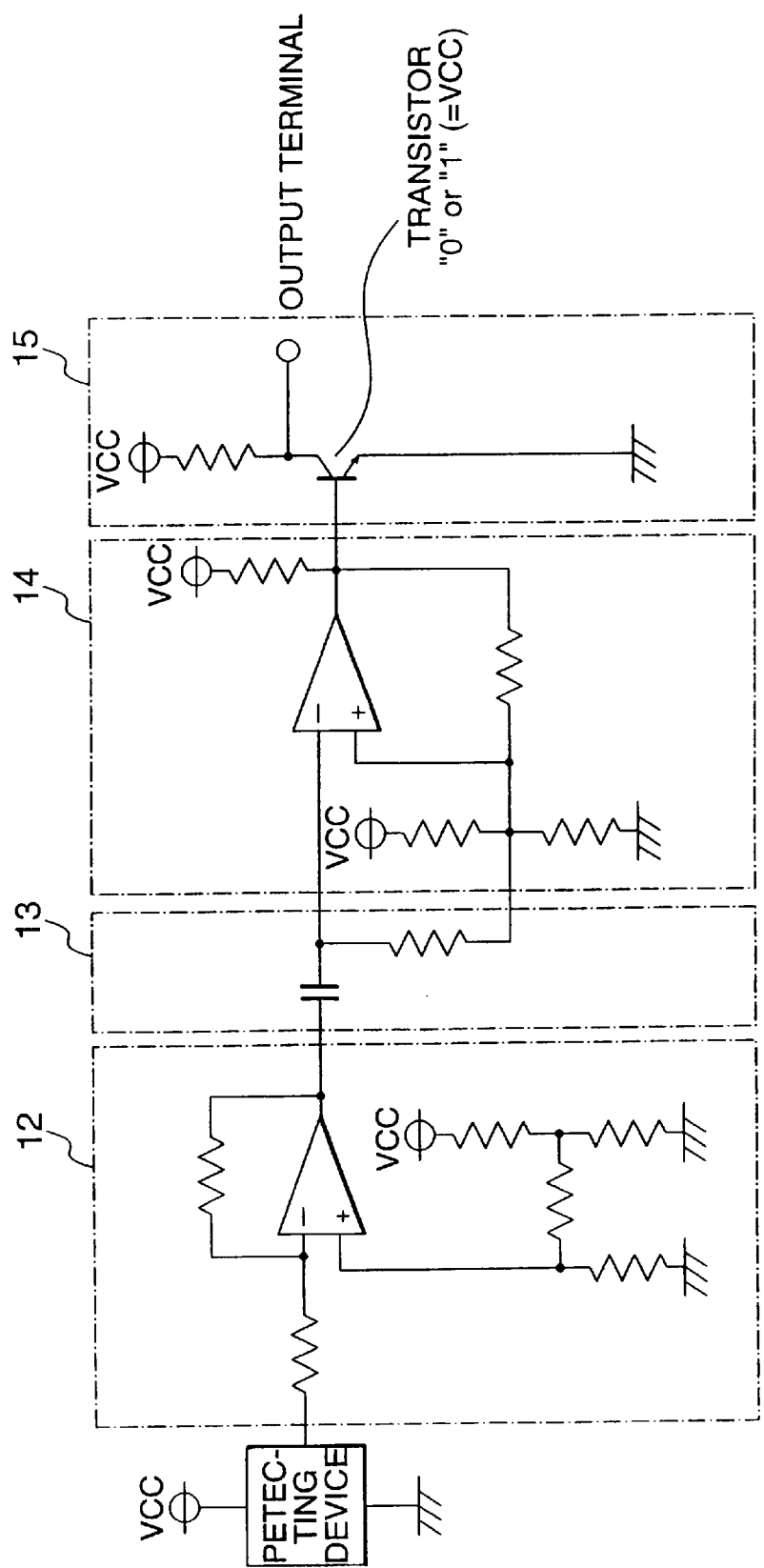
FIG. 13 is an electric circuit diagram of the conventional magnetic detector.
Figure 14A:
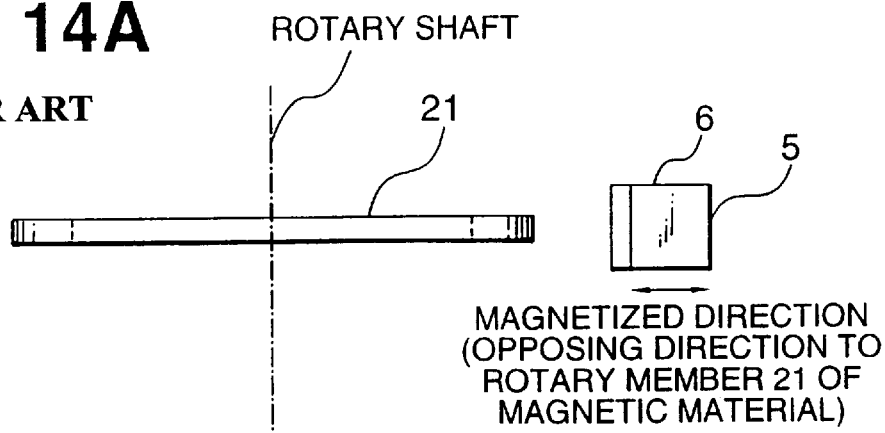
FIG. 14 is a schematic view showing a magnetic circuit of a conventional magnetic detector using MR devices.
Figure 14B:
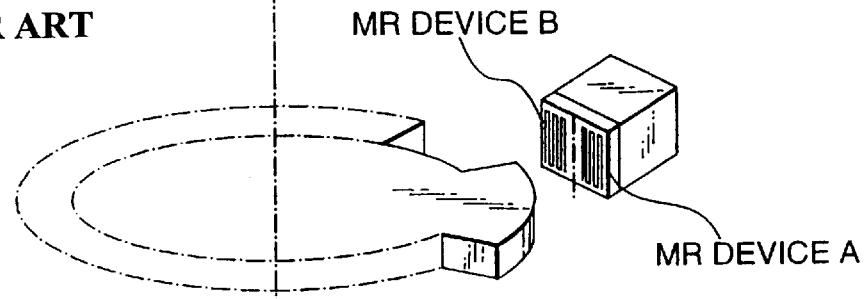
Figure 14C:
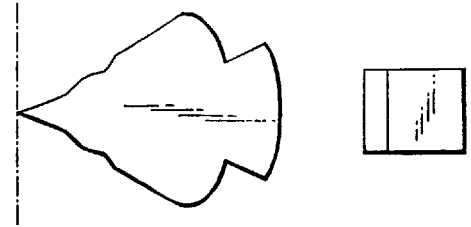
Figure 15:
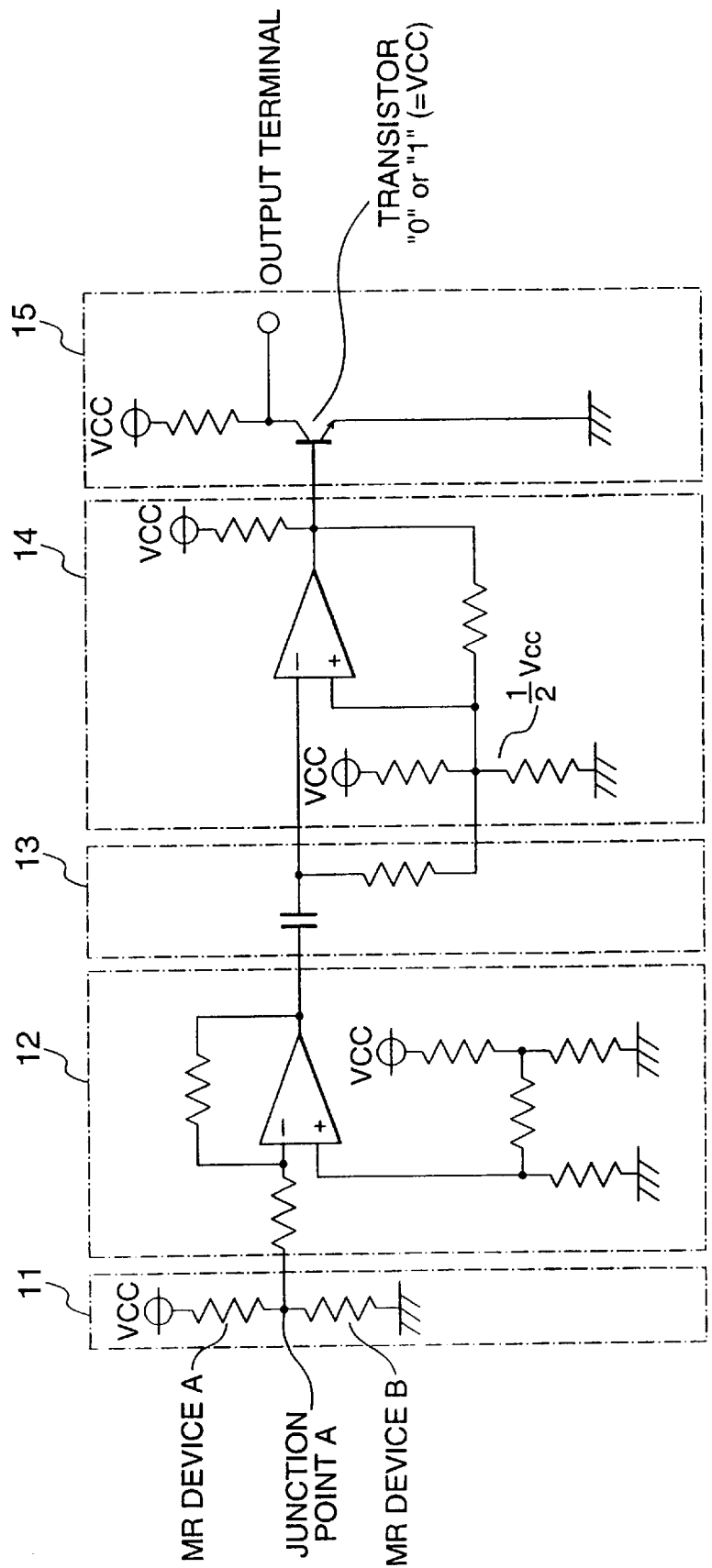
FIG. 15 is an electric circuit diagram of the conventional magnetic detector using MR devices.
Figure 16A:
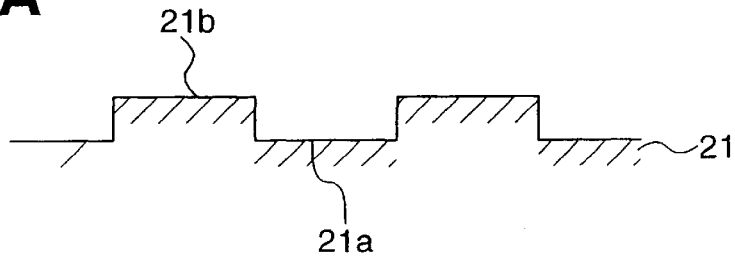
FIG. 16 is a waveform chart showing the waveform processing operation of the conventional magnetic detector using MR devices during high-speed rotation.
Figure 16B:
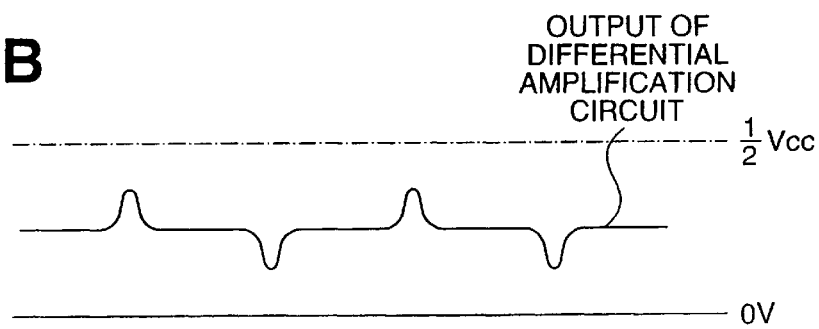
Figure 16C:
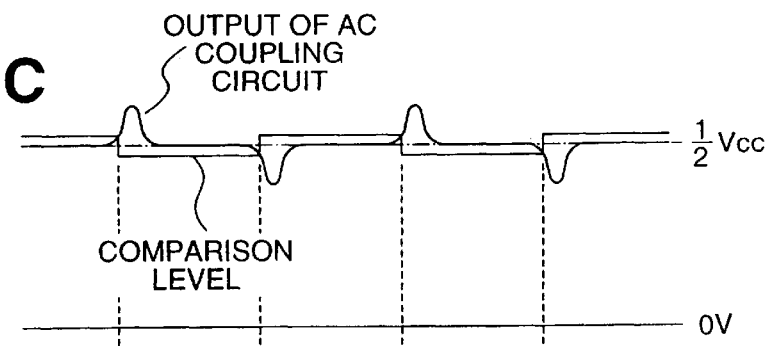
Figure 16D:
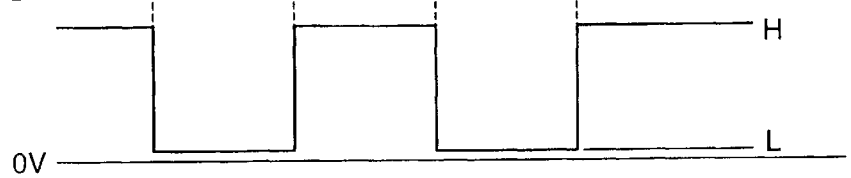
Figure 17A:
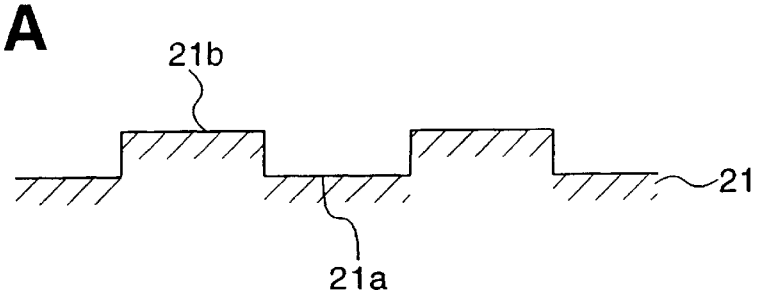
FIG. 17 is a waveform chart showing the waveform processing operation of the conventional magnetic detector using MR devices during low-speed rotation.
Figure 17B:
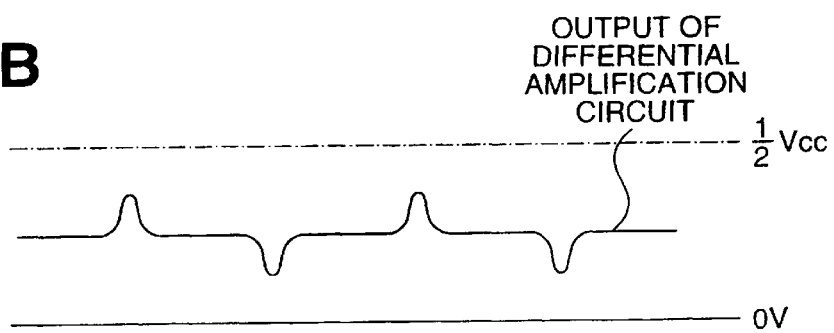
Figure 17C:
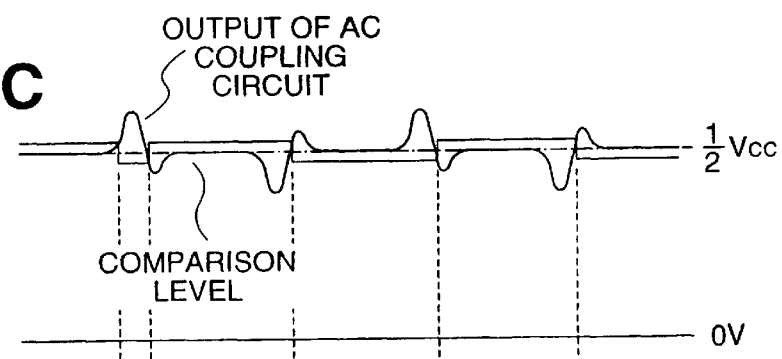
Figure 17D:
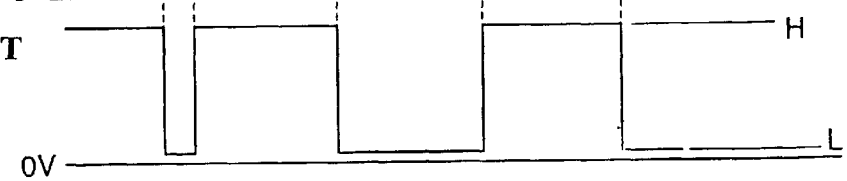

In this embodiment, a construction of the magnetic detector is basically the same as the conventional magnetic detector shown in FIG. 12 except that a Hall device is used as a magnetic field sensing device. The Hall device is a device which is sensitive to only a magnetic field vertically to the device surface and outputs a voltage proportional to the magnetic flux passing the device surface.

A detecting unit 6 is arranged between a magnet 5 as magnetic field generating means, which is magnetized in a direction opposing to a rotary member of magnetic material 21 as a moving member of magnetic material, and the rotary member of magnetic material 21 so that the magnetism sensing direction of the Hall device and the magnetized direction of the magnet are aligned with each other. With this arrangement, the magnetic detector can produce a signal which has a maximum level corresponding to a projected portion 21b of the rotary member of magnetic material 21 and a minimum level corresponding to a recessed portion 21a thereof, but includes no peak corresponding to each edge of the projected portion 21b.

More specifically, when the recessed portion 21a of the rotary member of magnetic material 21 is opposed to the magnetic detector, a smaller amount of magnetic flux passes the Hall device and therefore the Hall device produces a smaller output voltage. When the projected portion 21b of the rotary member of magnetic material 21 is opposed to the magnetic detector, the magnetic flux is attracted by the projected portion 21b to increase an amount of magnetic flux passing the Hall device and therefore the Hall device produces a larger output voltage.

Further, in this embodiment, resistance values of variable resistors R1a, R1b, which are incorporated in a differential amplification circuit 12 to serve as adjusting means, are adjusted so that a comparison level of a comparison circuit 14, which is provided as converting means downstream of the differential amplification circuit 12 through an AC coupling circuit 13 as DC component removing means, is set between a signal level corresponding to the projected portion 21b and a signal level corresponding to the recessed portion 21a.

By so setting the comparison level, the magnetic detector can perform precise detection even when the rotary member of magnetic material 21 is rotating at a very low speed, and can output a signal having levels corresponding to the recessed and projected portions when power is turned on and when the rotary member of magnetic material is stopped.

The Hall device may be replaced by a semiconductor magnetoresistive device without losing similar advantages as mentioned above.

Depending on the positional relationship between the magnetic field sensing device and the magnet 5, as shown in FIG. 3, there may occur a peak corresponding to each edge of the projected portion 21b of the rotary member of magnetic material 21. Even in such a case, however, similar advantages as mentioned above can be obtained by selecting such an arrangement that a level corresponding to the projected portion 21b and a level corresponding to the recessed portion 21a has a difference between them.
Embodiment 2.

Figure 4:
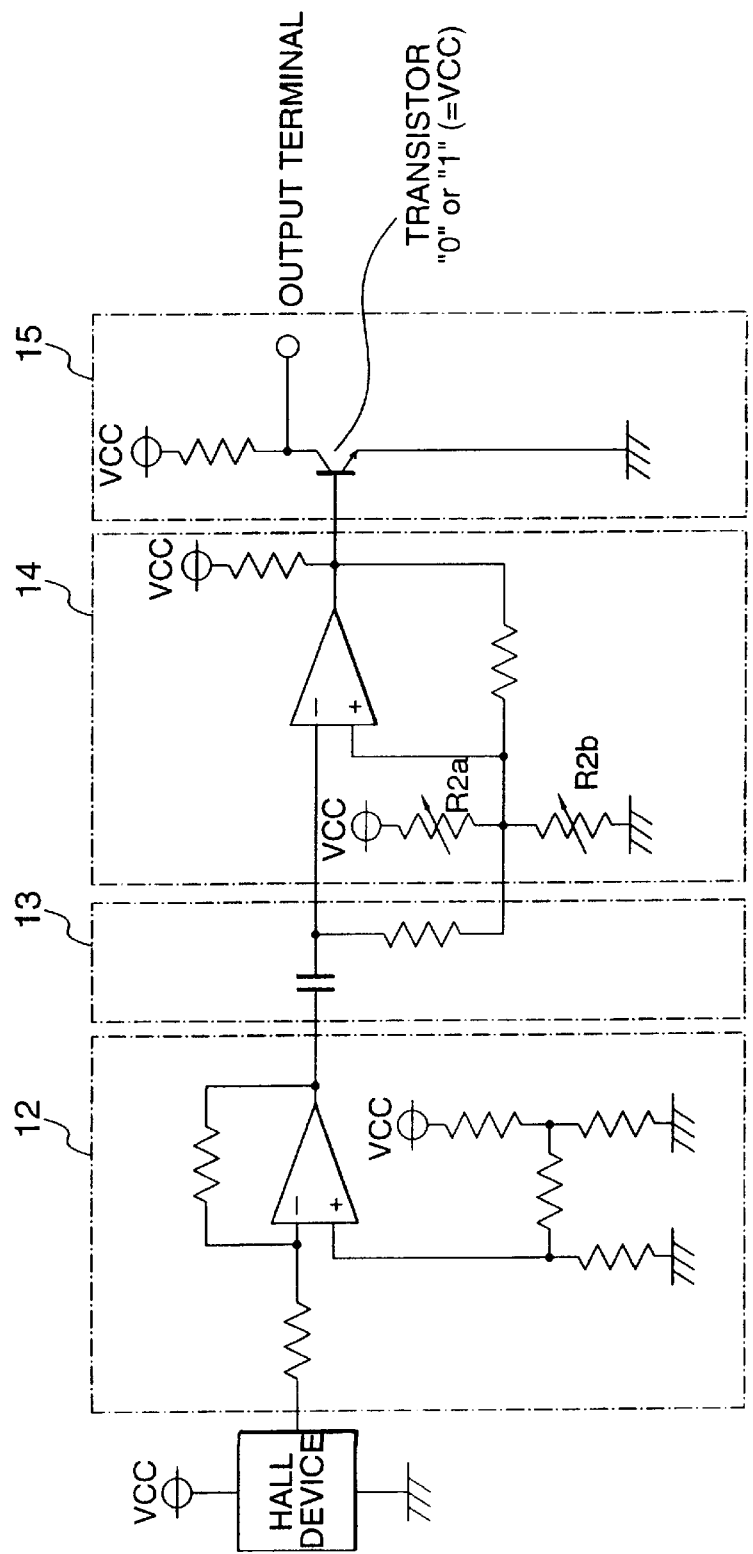
FIG. 4 is an electric circuit diagram of a magnetic detector according to Embodiment 2 of the present invention.

FIG. 4 is an electric circuit diagram of a magnetic detector according to Embodiment 2 of the present invention, and FIG. 5 is a waveform chart showing the waveform processing operation of the magnetic detector. In FIG. 4, components corresponding to those in FIG. 1 are denoted by the same reference numerals and the description thereof is omitted here.

In Embodiment 1 above, the comparison level is set by adjusting the resistance values of the variable resistors RI of the differential amplification circuit 12. On the other hand, in this Embodiment 2, the comparison level is set between a signal level corresponding to the projected portion 21b and a signal level corresponding to the recessed portion 21a by adjusting resistance values of variable resistors R2 as adjusting means for the comparison circuit 14.

With such an adjustment, this embodiment can also provide similar advantages as in Embodiment 1.
Embodiment 3.

Figure 6A:
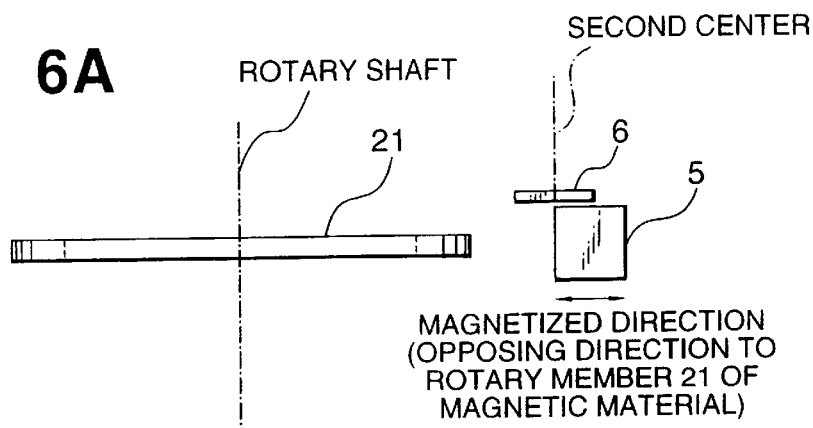
FIG. 6 is a schematic view showing a magnetic circuit of a magnetic detector according to Embodiment 3 of the present invention.
Figure 6B:
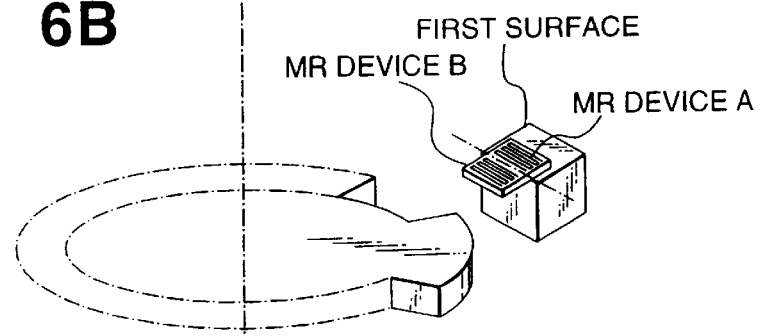
Figure 6C:
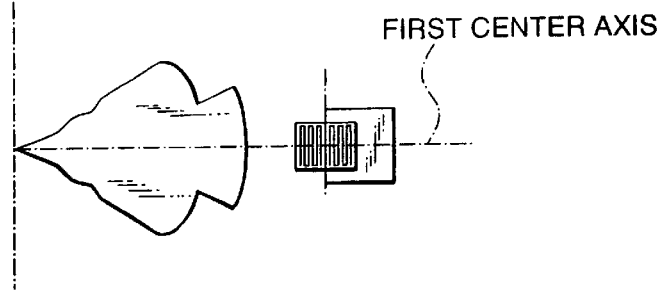

FIG. 6 is a schematic view showing a magnetic circuit of a magnetic detector according to Embodiment 3 of the present invention; specifically, FIG. 6A is a side view, FIG. 6B is a perspective view, and FIG. 6C is a plan view.

In this embodiment, an electric circuit diagram is the same as that in Embodiments 1 and 2 above except that an MR device is used instead of a Hall device, and a waveform chart showing the waveform processing operation is the same as that in Embodiments 1 and 2 above; hence these diagram and chart are omitted here.

This embodiment employs, as the magnetic field sensing device, an MR device which is an in-plane-sensitive magnetoresistive device. A detecting unit 6 with a pair of MR devices incorporated therein is provided on a first surface of the magnet 5 which is magnetized in a direction opposing the rotary member of magnetic material 21, and is arranged such that the pair of MR devices lie side by side in the opposing direction to the rotary member of magnetic material 21 and a second center axis of the pair of MR devices is substantially aligned with an end surface of the magnet 5 which is opposed to the rotary member of magnetic material 21. In addition, a pattern of each MR device is formed to have a magnetism detecting direction aligned with the magnetized direction of the magnet 5.

With that arrangement, the magnetic detector can produce a signal which has a maximum level corresponding to the projected portion 21b of the rotary member of magnetic material 21 and a minimum level corresponding to the recessed portion 21a thereof, but includes no peak corresponding to each edge of the projected portion 21b. Means for setting the comparison level of the comparison circuit 14 is the same as in Embodiments 1 and 2 above. As a result, the magnetic detector can perform precise detection even when the rotary member of magnetic material 21 is rotating at a very low speed, and can output a signal having levels corresponding to the recessed and projected portions when power is turned on and when the rotary member of magnetic material is stopped.

A point to be noted here is that the MR device has anisotropy. In other words, the MR device must be arranged to have such a pattern direction that the magnetism sensing direction is coincident with the magnetized direction of the magnet 5, as shown in FIG. 6.

Figure 7:
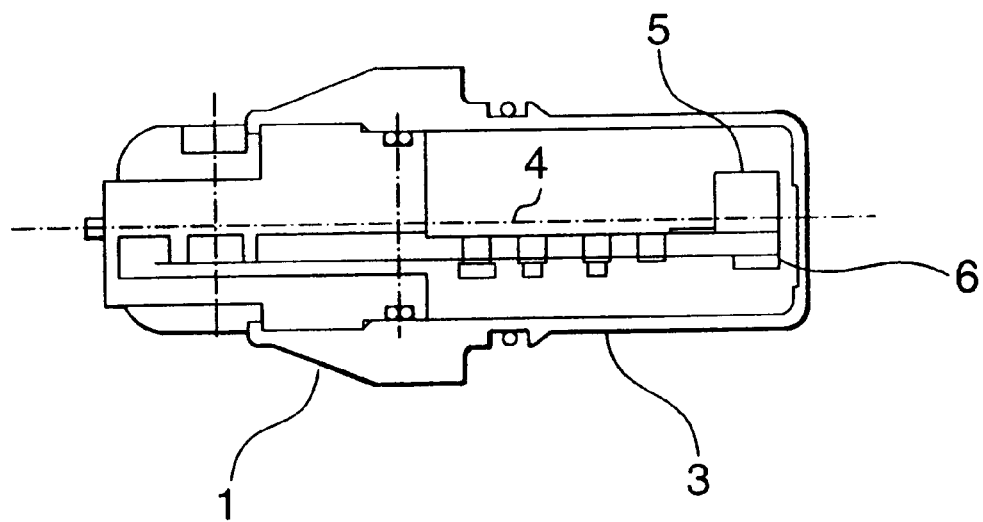
FIG. 7 is a sectional view of the magnetic detector according to Embodiment 3 of the present invention.

FIG. 7 is a sectional view of the magnetic detector according to Embodiment 3.

In Embodiments 1 and 2 above, a mount surface of the detecting unit 6 and a mount surface of electronic parts constituting an electric circuit unit 4 are positioned perpendicularly to each other. This type of magnetic detector is hence required to be mounted from two directions, or to be first mounted from one direction and then bent perpendicularly with respect to the mounting direction.

On the other hand, in this embodiment, since the detecting unit 6 is provided on the first (upper) surface of the magnet 5, which is magnetized in the opposing direction to the rotary member of magnetic material 21, and is arranged such that the first center axes of the MR device and the magnet 5 are substantially aligned with each other, mounting of the detecting unit 6 and mounting of electronic parts constituting the electric circuit unit 4 can be made in the same direction, resulting in improved productivity. Also, since there is no need for additional bending after the mounting in one direction, the position of the detecting unit 6 with respect to the magnet 5 is stabilized and a characteristic of the magnetic detector is improved.
Embodiment 4.

Figure 8A:
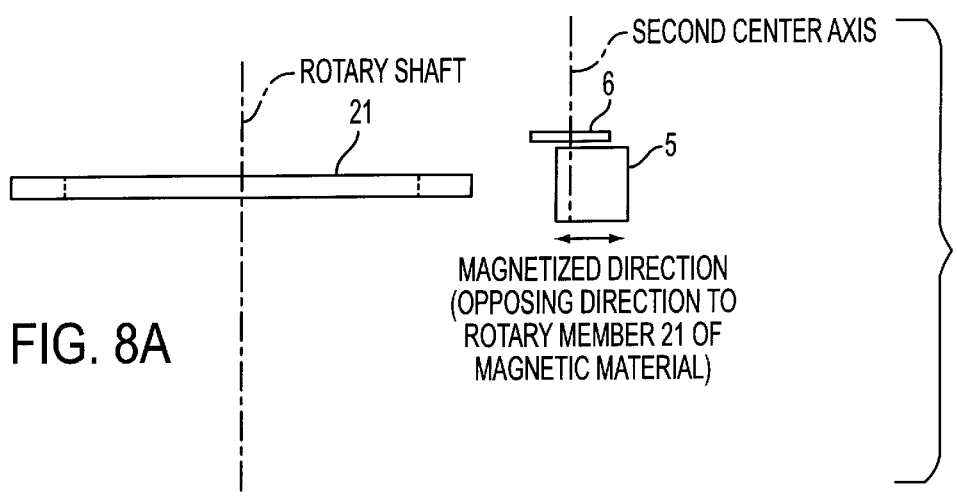
FIG. 8 is a schematic view showing a magnetic circuit of a magnetic detector according to Embodiment 4 of the present invention.
Figure 8B:
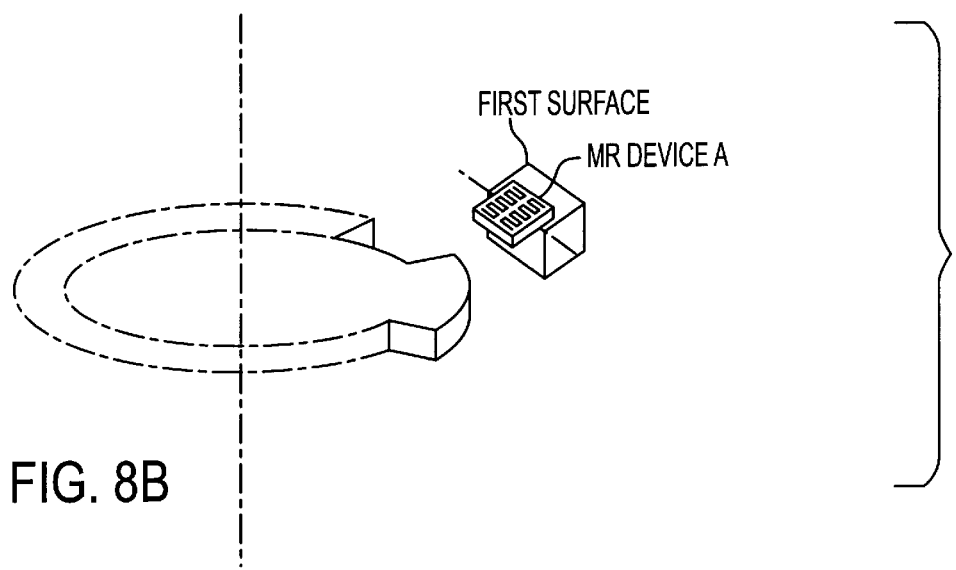
Figure 8C:
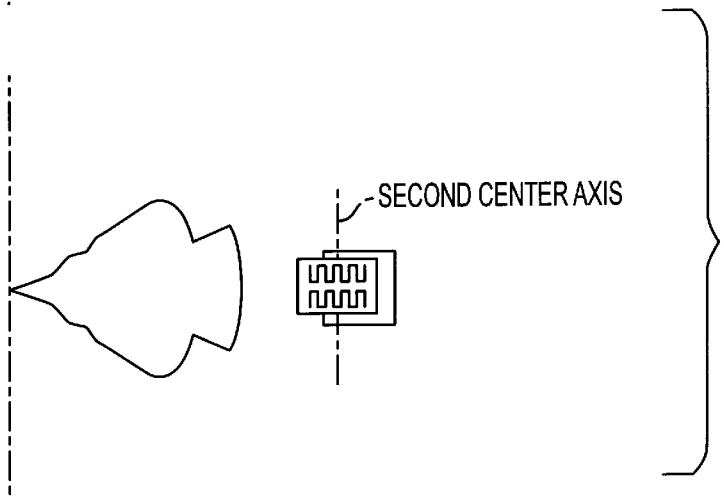

FIG. 8 is a schematic view showing a magnetic circuit of a magnetic detector according to Embodiment 4 of the present invention; specifically, FIG. 8A is a side view, FIG. 8B is a perspective view, and FIG. 8C is a plan view.

In this embodiment, an electric circuit diagram is the same as that in Embodiments 1 and 2 above except that an MR device is used as the magnetic field sensing device instead of a Hall device, and a waveform chart showing the waveform processing operation is the same as that in Embodiments 1 and 2 above; hence these diagram and chart are omitted here. Note that a fixed resistor is used as one MR device in this embodiment.

This embodiment employs, as the magnetic field sensing device, an MR device which is an in-plane-sensitive magnetoresistive device. A detecting unit 6 with an MR device incorporated therein is provided on a first surface of the magnet 5 which is magnetized in a direction opposing to the rotary member of magnetic material 21, and is arranged such that the MR device lies in a rotating direction of the rotary member of magnetic material 21 and a second center axis of the MR device is positioned rearward of an end surface of the magnet 5 which is opposed to the rotary member of magnetic material 21. In addition, a pattern of the MR device is formed to have a magnetism detecting direction aligned with the magnetized direction of the magnet 5.

With that arrangement, the magnetic detector can produce a signal which has a maximum level corresponding to the projected portion 21b of the rotary member of magnetic material 21 and a minimum level corresponding to the recessed portion 21a thereof, but includes no peak corresponding to each edge of the projected portion 21b. Means for setting (adjusting) the comparison level of the comparison circuit 14 is the same as in Embodiments 1 and 2 above.

As a result, the magnetic detector can perform precise detection even when the rotary member of magnetic material 21 is rotating at a very low speed, and can output a signal having levels corresponding to the recessed and projected portions when power is turned on and when the rotary member of magnetic material is stopped.

A point to be noted here is that the MR device has anisotropy. In other words, the MR device must be arranged to have such a pattern direction that the magnetism sensing direction is coincident with the magnetized direction of the magnetic 5, as shown in FIG. 8.

Further, as with above Embodiment 3, mounting of the detecting unit 6 and mounting of electronic parts constituting the electric circuit unit 4 can be made in the same direction, resulting in improved productivity. Also, since there is no need for additional bending after the mounting in one direction, the position of the detecting unit 6 with respect to the magnet 5 is stabilized and a characteristic of the magnetic detector is improved.
Embodiment 5.

Figure 9A:
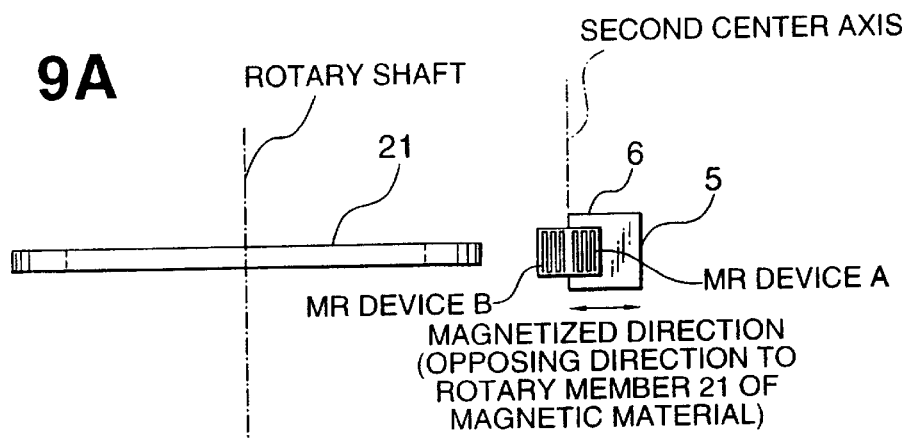
FIG. 9 is a schematic view showing a magnetic circuit of a magnetic detector according to Embodiment 5 of the present invention.
Figure 9B:
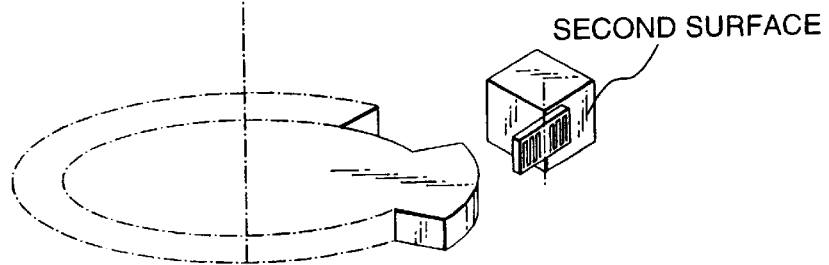
Figure 9C:
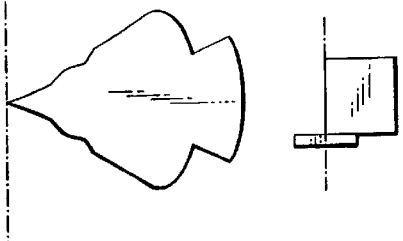
Figure 10:
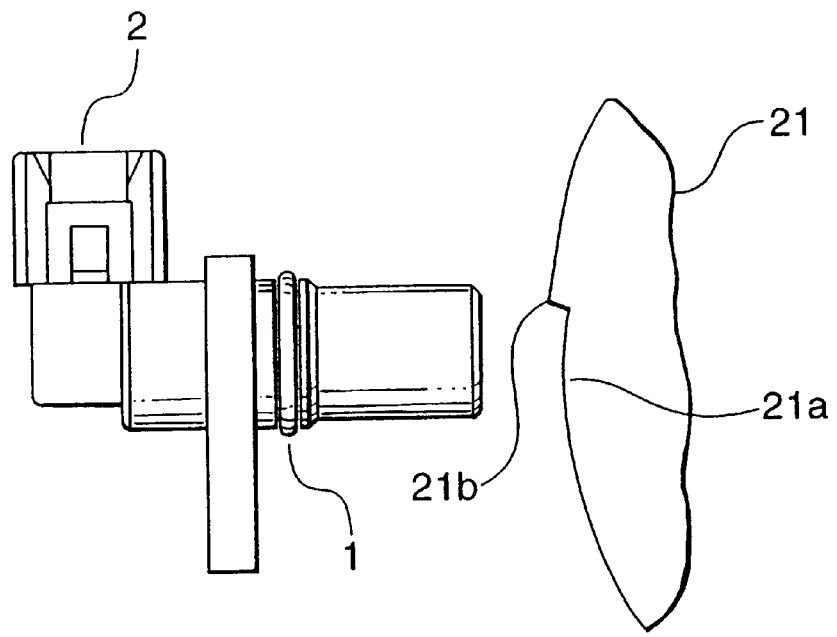
FIG. 10 is a side view of a conventional magnetic detector.
Figure 11:
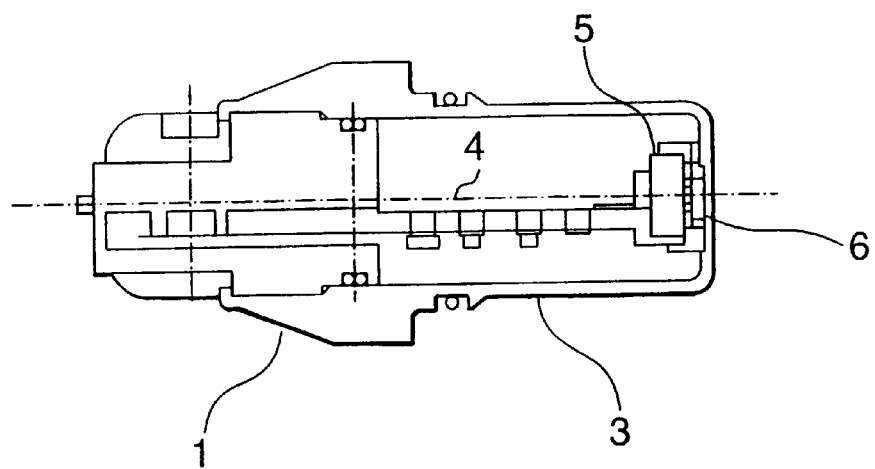
FIG. 11 is a side sectional view of the conventional magnetic detector.

FIG. 9 is a schematic view showing a magnetic circuit of a magnetic detector according to Embodiment 5 of the present invention; specifically, FIG. 9A is a side view, FIG. 9B is a perspective view, and FIG. 9C is a plan view.

In this embodiment, an electric circuit diagram is the same as that in Embodiments 1 and 2 above except that an MR device is used as the magnetic field sensing device instead of a Hall device, and a waveform chart showing the waveform processing operation is the same as that in Embodiments 1 and 2 above; hence these diagram and chart are omitted here.

This embodiment employs, as the magnetic field sensing device, an MR device which is an in-plane-sensitive magnetoresistive device. A detecting unit 6 with a pair of MR devices incorporated therein is provided on a second surface of the magnet 5 which is magnetized in a direction opposing to the rotary member of magnetic material 21, and is arranged such that the pair of MR devices lie side by side in the opposing direction to the rotary member of magnetic material 21 and a second center axis of the pair of MR devices is positioned substantially aligned with an end surface of the magnet 5 which is opposed to the rotary member of magnetic material 21. In addition, a pattern of the MR device is formed to have a magnetism detecting direction aligned with the magnetized direction of the magnet 5.

With that arrangement, the magnetic detector can produce a signal which has a maximum level corresponding to the projected portion 21b of the rotary member of magnetic material 21 and a minimum level corresponding to the recessed portion 21a thereof, but includes no peak corresponding to each edge of the projected portion 21b. Means for setting (adjusting) the comparison level of the comparison circuit 14 is the same as in Embodiments 1 and 2 above.

As a result, the magnetic detector can perform precise detection even when the rotary member of magnetic material 21 is rotating at a very low speed, and can output a signal having levels corresponding to the recessed and projected portions when power is turned on and when the rotary member of magnetic material is stopped. Further, since the MR device exhibits larger resistance changes in this embodiment than Embodiment 3 above, an output voltage of the bridge circuit 11 is increased and a characteristic of the magnetic detector is improved.

Embodiment 6.

While the MR device is used as the magnetic field sensing device in each of above Embodiments 3 to 5, this Embodiment 6 uses a GMR (gigantic magnetoresistive) device. By using a GMR device, it is possible to produce a larger output and achieve a better characteristic of the magnetic detector than using the MR device. Further, since the GMR device has no anisotropy, the magnetic detector can be designed with more flexibility while the pattern direction is not subject to any restriction.

Embodiment 7.

While, in each of Embodiments above, the moving member of magnetic material has been described as a rotary member of magnetic material which is rotated in synch with a rotary shaft, the present invention is likewise applicable to a moving member of magnetic material which displaces linearly, and similar advantages can also be obtained. As applications of this embodiment, it is conceivable to detect, e.g., an opening of an EGR valve used in internal combustion engines.

What is claimed is:

1. A magnetic detector comprising:
   a moving member constructed of magnetic material;
   a detector for detecting a displacement of said moving member of magnetic materials;
   a DC component removing unit for removing a DC component from an output signal of said detector;
   a converter for converting an output signal of said DC component removing unit into a binary signal;
   an output unit for outputting an output signal of said converter; and
   a signal level adjustor operative to variably set a conversion reference level signal of said converter between two different signal levels.

2. A magnetic detector according to claim 1, wherein output signals of said detector correspond to projected and recessed portions of said moving member of magnetic material and provide maximum and minimum signal levels.

3. A magnetic detector according to claim 1 further comprising a magnetic field generator for generating a magnetic field, and wherein:
   said detector is a magnetic field sensing device and is arranged to have a magnetism detecting direction parallel to a magnetized direction of said magnetic field generator; and
   said moving member of magnetic material is disposed at a predetermined distance from said magnetic field generator to change the magnetic field generated by said magnetic field generator,
   whereby said magnetic field sensing device detects changes in the magnetic field produced by moving said moving member of magnetic material.

4. A magnetic detector according to claim 3, wherein said magnetic field sensing device comprises a vertically-sensitive magnetic field sensing device arranged between said magnetic field generator and said moving member of magnetic material.

5. A magnetic detector according to claim 3, wherein said magnetic field sensing device comprises an in-plane-sensitive magnetic field sensing device which is provided on at least one of first and second surfaces of said magnetic field generator and arranged so that the output signal of said magnetic field sensing device has a predetermined waveform.

6. A magnetic detector according to claim 5, wherein at least two magnetic field sensing devices are disposed side by side in a direction opposing said magnetic field generator, and a second center axis of said magnetic field sensing devices is arranged to be substantially aligned with an end surface of said magnetic field generator which opposes said moving member of magnetic material.

7. A magnetic detector according to claim 5, wherein at least two magnetic field sensing devices are disposed side by side in a rotating direction of said moving member of magnetic material, and a second center axis of said magnetic field sensing devices is arranged rearward of an end surface of said magnetic field generator which is opposed to said moving member of magnetic material.

8. A magnetic detector according to claim 5, wherein said magnetic field sensing device comprises a giant magnetoresistance device.

9. A magnetic detector comprising:
   a moving member constructed of magnetic material;
   detecting means for detecting a displacement of said moving member of magnetic material;
   DC component removing means for removing a DC component from an output signal of said detecting unit;
   converting means for converting an output signal of said DC component removing unit into a binary signal;
   output means for outputting an output signal of said converting unit; and
   signal level adjusting means for variably setting a conversion reference level signal of said converting unit between two different signal levels.

10. A magnetic detector according to claim 9, wherein output signals of said detecting means correspond to projected and recessed portions of said moving member of magnetic material and provide maximum and minimum signal levels.

11. A magnetic detector according to claim 9 further comprising magnetic field generating means for generating a magnetic field, and wherein:
   said detecting means has a magnetism detecting direction parallel to a magnetized direction of said magnetic field generating means; and
   said moving member of magnetic material is disposed at a predetermined distance from said magnetic field generating means to change the magnetic field generated by said magnetic field generating means,
   whereby said detecting means detects changes in the magnetic field produced by moving said moving member of magnetic material.

12. A magnetic detector according to claim 11, wherein said detecting means comprises a vertically-sensitive magnetic field sensing means for sensing the magnetic field between said magnetic field generating means and said moving member of magnetic material.

13. A magnetic detector according to claim 11, wherein said magnetic field sensing means comprises an in-planesensitive magnetic field sensing means on at least one of first and second surfaces of said magnetic field generating means so that the output signal of said magnetic field sensing means has a predetermined waveform.

14. A magnetic detector according to claim 13, wherein at least two magnetic field sensing means are disposed side by side in a direction opposing said magnetic field generating means, and a second center axis of said magnetic field sensing means is substantially aligned with an end surface of said magnetic field generating means which opposes said moving member of magnetic material.

15. A magnetic detector according to claim 13, wherein at least two magnetic field sensing means are disposed side by side in a rotating direction of said moving member of magnetic material, and a second center axis of said magnetic field sensing means is arranged rearward of an end surface of said magnetic field generating means which is opposed to said moving member of magnetic material.

16. A magnetic detector according to claim 13, wherein said magnetic field sensing means comprises a giant magnetoresistance device.

* * * * *